ically conductive coating, and coating a

(12) United States Patent
Rolison

(10) Patent No.: US 9,997,692 B2
(45) Date of Patent: Jun. 12, 2018

(54) THERMOELECTRIC MATERIALS

(75) Inventor: Debra R Rolison, Arlington, VA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 432 days.

(21) Appl. No.: 13/433,620

(22) Filed: Mar. 29, 2012

(65) Prior Publication Data
US 2012/0247524 A1    Oct. 4, 2012

Related U.S. Application Data

(60) Provisional application No. 61/468,766, filed on Mar. 29, 2011.

(51) Int. Cl.
| H01L 35/00 | (2006.01) |
| H01L 35/34 | (2006.01) |
| H01L 35/16 | (2006.01) |
| H01L 35/22 | (2006.01) |

(52) U.S. Cl.
CPC .............. *H01L 35/22* (2013.01); *H01L 35/16* (2013.01)

(58) Field of Classification Search
CPC ................................ H01L 35/22; H01L 35/16
USPC .................................................. 136/201–242
See application file for complete search history.

(56) References Cited

U.S. PATENT DOCUMENTS

| 6,290,880 | B1 | 9/2001 | Ryan et al. |
| 6,649,091 | B2 | 11/2003 | Ryan et al. |
| 6,649,211 | B2 | 11/2003 | Lyons et al. |
| 7,259,320 | B2 * | 8/2007 | Take .......................... 136/236.1 |
| 2007/0240749 | A1 | 10/2007 | Ohtaki |
| 2008/0087314 | A1 * | 4/2008 | Xiao et al. ..................... 136/201 |
| 2008/0121263 | A1 * | 5/2008 | Schutte ................... H01L 35/32 |
|  |  |  | 136/203 |
| 2009/0025774 | A1 | 1/2009 | Plissonnier et al. |
| 2009/0092834 | A1 | 4/2009 | Rolison et al. |
| 2009/0185942 | A1 * | 7/2009 | Choi et al. ........................ 419/30 |
| 2010/0154856 | A1 * | 6/2010 | Hiroyama ............... H01L 35/32 |
|  |  |  | 136/236.1 |
| 2011/0091723 | A1 | 4/2011 | Long et al. |
| 2012/0025130 | A1 * | 2/2012 | Rowe et al. .................... 252/71 |

OTHER PUBLICATIONS

Search Report and Written Opinion in PCT/US2012/031092 (dated Jul. 23, 2012).
Armelao et al., "A molecular approach to RuO2-based thin films: sol-gel synthesis and characterisation" J. Non-Cryst. Solids 316 (2003) 364-371.

(Continued)

*Primary Examiner* — Magali P Slawski
*Assistant Examiner* — Kourtney R S Carlson
(74) *Attorney, Agent, or Firm* — US Naval Research Laboratory; Joseph T. Grunkemeyer

(57) ABSTRACT

Disclosed is an article having: a porous thermally insulating material, an electrically conductive coating on the thermally insulating material, and a thermoelectric coating on the electrically conductive coating. Also disclosed is a method of forming an article by: providing a porous thermally insulating material, coating an electrically conductive coating on the thermally insulating material, and coating a thermoelectric coating on the electrically conductive coating. The articles may be useful in thermoelectric devices.

22 Claims, 5 Drawing Sheets

(56) References Cited

OTHER PUBLICATIONS

Biswas et al, "Synthesis and characterization of nanocrystals of the oxide metals, RuO2, IrO2, and ReO3" J. Nanosci. Nanotechnol. 7 (2007) 1969-1974 (abstract only).

Chervin et al., Making the Most of a Scarce Platinum-Group Metal: Conductive Ruthenia Nanoskins on Insulating Silica Paper, Nano Lett. 9 (2007) 2316-2321.

Chueh et al., "RuO2 Nanowires and RuO2/TiO2 Core/Shell Nanowires: From Synthesis to Mechanical, Optical, Electrical, and Photoconductive Properties" Adv. Mater. 19 (2007) 143-149.

Kanatzidis, "Nanostructured Thermoelectrics: The New Paradigm?" Chem. Mater. 22 (2010) 648-659.

Korotcov et al., "Deposition and characterization of 1D RuO2 nanocrystals by reactive sputtering" J. Alloys Compounds 442 (2007) 310-312.

Liao et al., "Characterization of RuO2 thin films deposited on Si by metal-organic chemical vapor deposition" Thin Solid Films 287 (1996) 74-79.

Magri et al., "Synthesis, properties and performances of electrodeposited bismuth telluride films" J. Mater. Chem 6 (1996) 773-779.

Martín-González et al., "Insights into the Electrodeposition of Bi2Te3" J. Electrochem. Soc. 149 (2002) C546-C554.

Minnich et al., "Bulk nanostructured thermoelectric materials: current research and future prospects" Energy Environ. Sci. 2 (2009) 466-479.

Ryan et al., "Electronic connection to the interior of amesoporous insulator with nanowires of crystalline RuO2" Nature 406 (2000) 169-172.

Sugimoto et al., "Fabrication of Thin-Film, Flexible, and Transparent Electrodes Composed of Ruthenic Acid Nanosheets by Electrophoretic Deposition and Application to Electrochemical Capacitors" J. Electrochem. Soc. 153 (2006) A255-A260.

Swider-Lyons et al., "Selective Vapor Deposition of Hydrous RuO2 Thin Films" J. Electrochem. Soc. 152 (2005) C158-162.

Takahashi et al., "The composition and conductivity of electrodeposited Bi—Te allow films" Thin Solid Films 240 (1994) 70-72.

\* cited by examiner

THERMOELECTRIC MATERIALS

This application claims the benefit of U.S. Provisional Application No. 61/468,766, filed on Mar. 29, 2011. The provisional application and all other publications and patent documents referred to throughout this nonprovisional application are incorporated herein by reference.

TECHNICAL FIELD

The present disclosure is generally related to thermoelectric articles.

DESCRIPTION OF RELATED ART

Interest in improved thermoelectric materials has increased with the growing need to replace CFC-based cooling systems and to create in situ cooling for advanced electronic applications, e.g., high density integrated circuitry and high $T_c$ superconductor-based systems. Improved thermoelectrics figure prominently as well in any portfolio of strategies to improve energy efficiency and minimize use of fossil-fuels by generating power from waste heat (Minnich et al., *Energy Environ. Sci.* 2 (2009) 466-479).

High-performance thermoelectric devices have been sought that generate a high temperature-normalized figure of merit, ZT $$ZT = \frac{\sigma}{\kappa} S^2 T$$

in which the ratio of the electronic conductivity ($\sigma_e$) to thermal conductivity ($\kappa$) of the thermoelectric material is amplified by its Seebeck coefficient (S) and normalized to the temperature of operation. A material's intrinsic property is inherent in the figure of merit, namely the thermopower defined as $\sigma S^2$.

Efforts to find bulk, homogeneous compounds that perform well as thermoelectric materials has been limited by low efficiencies, where the temperature-normalized figure of merit has been pinned at ca. 1 for decades (Minnich et al., *Energy Environ. Sci.* 2 (2009) 466-479; Kanatzidis, *Chem. Mater.* 22 (2010) 648-659). Thermoelectric efficiency would be improved if modifications to one or all of the materials properties found in the figure of merit, ZT, could achieve: increased Seebeck coefficient; increased electronic conductivity; or decreased thermal conductivity.

Key directions underway to bring nanostructured approaches to an old technology that ultimately still requires mass to interact with relevant amounts of heat include (a) creating inhomogeneities (e.g., inclusions) that self-form within bulk materials and that act as scattering centers to disrupt phononic transport without deleteriously impacting electronic transport and (b) processing promising thermoelectric materials into nanocrystalline pieces that are then sintered or pressed into bulk objects (Kanatzidis, *Chem. Mater.* 22 (2010) 648-659). Regardless, a macroscale amount of thermoelectric material must be created, not a microscopic amount. Historically, creating a composite comprising a mix of a good thermal insulator with a good electronic material has not improved ZT.

A method has been demonstrated to deposit self-wired networks of nanoscopic $RuO_2$ onto electrically and electrochemically inert substrates such as mesoporous, high-surface-area $SiO_2$ aerogels (Ryan et al., *Nature* 406 (2000) 169-172) or macroporous $SiO_2$ filter papers (Chervin et al., *Nano Lett.* 9 (2009) 2316-2321; Chervin et al., *J. Electroanal. Chem.* 644 (2010) 155-163), FIG. 2. The $RuO_2$ nanoparticles form an ~2-nm-thick, through-connected network on substrates of high curvature or contiguous shell on substrates of low curvature, such as the >100-nm diameter fibers in silica-fiber paper (U.S. Patent Application Publication No. 2009/0092834) or ~10-nm-thick skins on planar substrates (U.S. Patent Application Publication No. 2011/0091723), such as optical windows. The $RuO_2$-coated $SiO_2$ paper (designated $RuO_2(SiO_2)$ paper) contains ~300 ng $cm^{-2}$ of 2-3-nm $RuO_2$ nanoparticles that occupy only ~0.1 vol % of the total object, yet the paper displays a geometry-normalized conductivity of ~0.5 S $cm^{-1}$ after heat treatment in air. The $RuO_2(SiO_2)$ paper also expresses large electrochemical capacitance (>600 F $g^{-1}$ as normalized to the mass of $RuO_2$) and high surface area of the conductive phase (~90 $m^2$ $g^{-1}$) indicating that a majority of the deposited $RuO_2$ is connected within the electronic circuit and electrochemically addressable, thereby optimizing utilization of this expensive component. As a substrate, the low cost, commercial availability, flow-through porosity, and relative robustness of the $SiO_2$ filter paper provide added practical benefits to this architectural design.

This same electroless deposition protocol has been extended to the deposition of self-limiting, ultrathin (~9 nm) $RuO_2$ coatings on planar substrates and determined that the electrical conductivity of $RuO_2$ in this form is ~1×$10^3$ S $cm^{-1}$. Further the spectral features of this nanometric coating is spectrally flat through the entire infrared region (near-IR to mid-IR to far-IR) with an optical density of ~0.11 per 1.6 kΩ sheet resistance per layer of $RuO_2$ (i.e., minimally absorptive), indicating a suppression of standard molecular vibrations in this form of the oxide (U.S. Patent Application Publication No. 2011/0091723).

BRIEF SUMMARY

Disclosed herein is an article comprising: a porous thermally insulating material; an electrically conductive coating on the thermally insulating material; and a thermoelectric coating on the electrically conductive coating.

Also disclosed herein is a method of forming an article comprising: providing a porous thermally insulating material; coating an electrically conductive coating on the thermally insulating material; and coating a thermoelectric coating on the electrically conductive coating.

BRIEF DESCRIPTION OF THE DRAWINGS

A more complete appreciation of the invention will be readily obtained by reference to the following Description of the Example Embodiments and the accompanying drawings.

DETAILED DESCRIPTION OF EXAMPLE EMBODIMENTS

In the following description, for purposes of explanation and not limitation, specific details are set forth in order to provide a thorough understanding of the present disclosure. However, it will be apparent to one skilled in the art that the present subject matter may be practiced in other embodiments that depart from these specific details. In other instances, detailed descriptions of well-known methods and devices are omitted so as to not obscure the present disclosure with unnecessary detail.

Objects with enhanced thermoelectric properties are described in which two sequential modification steps serve to decouple the three key, normally interdependent, parameters that dictate performance metrics for thermoelectric devices, namely: electronic conductivity ($\sigma_e$), thermal conductivity ($\kappa$), and Seebeck coefficient (S). These three parameters are decoupled by first conformally depositing nanometric films (a.k.a. shells or skins or sheets) of an electron conductor such as $RuO_2$ onto a massive thermal insulator (mass ratio of insulator to $RuO_2$ may be $\sim \geq 10^2$); this step creates an object in which the electronic conductivity of the object, which can only arise in the nanometric skin or shell or sheet, is inherently decoupled from the thermal conductivity, which is dominated by the thermal mass of the object, which arises from the insulator (e.g., $SiO_2$), not the $RuO_2$ coating. In the second step, the poor Seebeck coefficient of the coated object (for $RuO_2(SiO_2)$ on the order of $10^0$ $\mu V\ K^{-1}$) is modified by depositing a thin thermoelectric material over the electron conductor. This second material imposes its Seebeck character onto the Seebeck properties of the object, which retains the thermal mass of the thermally insulating substrate (e.g., $SiO_2$) and the electronic wiring of the inner core of the nanoscale conductive coating.

Figure 1:
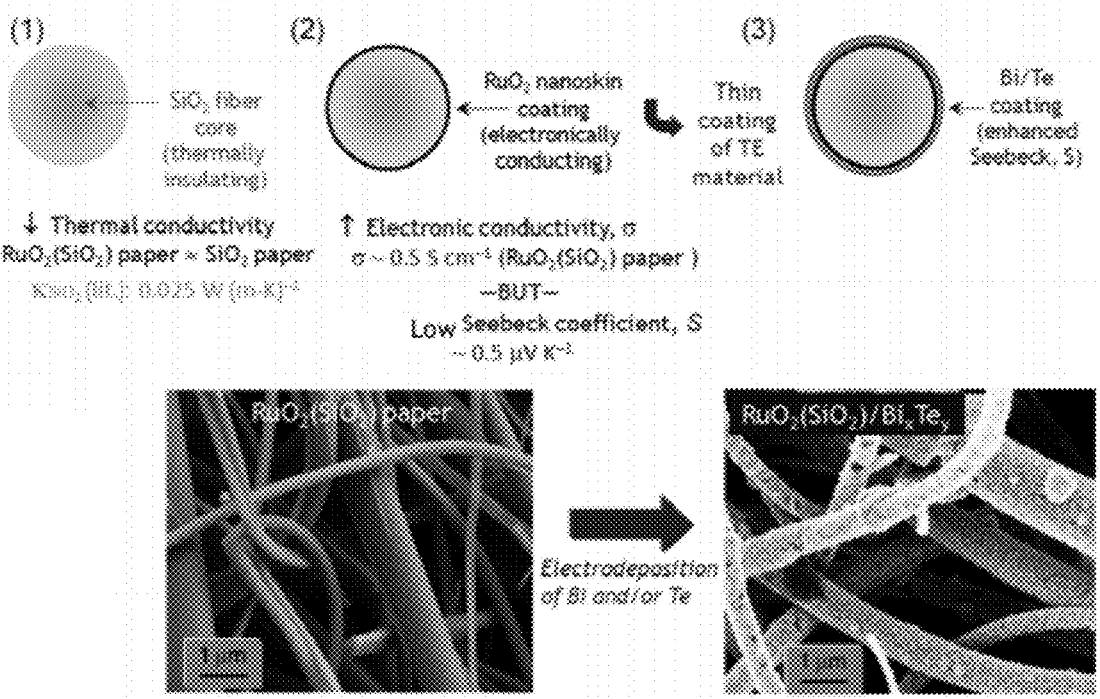
FIG. 1 shows a schematic depiction of a thermoelectric article.
Figure 2:
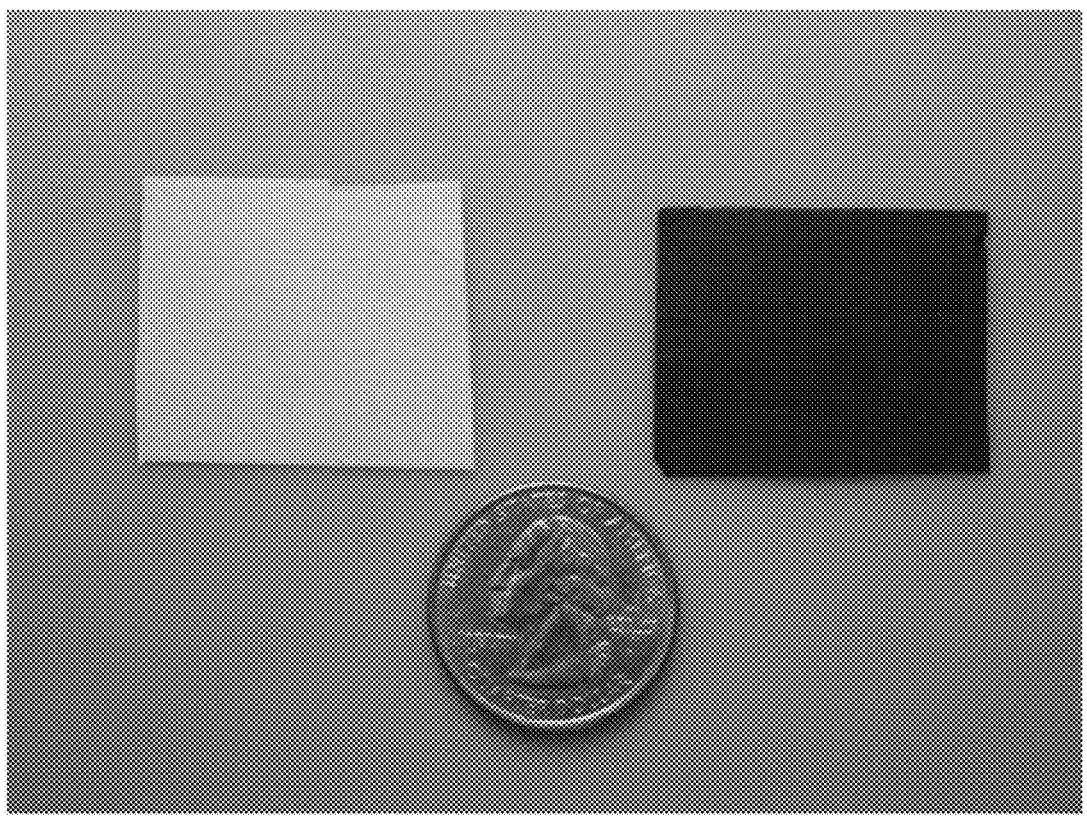
FIG. 2 shows fused silica ($SiO_2$) fiber paper (a.k.a. membrane) before (left) and after deposition of $RuO_2$ (right).

FIG. 1 shows a schematic depiction of the scheme to decouple the dependency of electronic conductivity, thermal conductivity, and Seebeck coefficient for a thermoelectric material by creating a macroscale object in which a nanoscale electron wire (~2-nm-thick film or shell or skin of $RuO_2$) moves electrons but not heat, while the substrate onto which it is electrolessly deposited in a conformal, self-limiting fashion is a thermal insulator thereby inherently decoupling the ratio of electronic/thermal conductivity of the object. The poor Seebeck coefficient of $RuO_2$ (−3-4 $\mu V$ $K^{-1}$ for bulk rutile $RuO_2$; 0.5 $\mu V\ K^{-1}$ for the particular specimen of $RuO_2(SiO_2)$ shown in FIG. 3) is overwritten for the object by a conformal, thin coating of a good thermoelectric material (e.g., a semi-metal such as Bi or Te or a compound such as $Bi_xTe_y$). The micrographs (FIG. 1) show the morphology of the $RuO_2$ nanoskin on the silica fibers before (left micrograph) and after (right micrograph) electrodepositing a thin film of $Bi_xTe_y$ on the $RuO_2$-coated $SiO_2$ fibers.

Ultrathin (2-10 nm), conformal $RuO_2$ films exhibit high electronic conductivity (~1000 S $cm^{-1}$ for planar nanosheets) and produce conductive $SiO_2$ papers with practical object conductivity of ~0.5 S $cm^{-1}$. The base object (an electronically conductive and thermally insulating paper) is produced with a simple and versatile chemical method capable of yielding uniform thickness coatings on simple and complex dielectric and insulating substrates. One aspect of the material relates to its inherent electrical conductivity as a result of the metallic properties of $RuO_2$ as well as the conduction properties of this particular type of $RuO_2$ produced by subambient thermal decomposition of ruthenium tetroxide following by heating. This coating has an optical transparency that spans the entire infrared region. In addition, the material can be functionalized using standard methods for oxide surfaces, thus permitting deposition of a thin, conformal coating of a material with a high Seebeck coefficient. The TE-modified base object retains the character of the high Seebeck coefficient material rather than the poor Seebeck coefficient measured for $RuO_2(SiO_2)$ that is defined by the $RuO_2$.

Thermoelectric materials with a figure of merit>2 would allow development of shipboard cooling systems as replacements for current CFC-based systems. Not only are thermoelectric cooling systems environmentally friendly, they are more suitable for a decentralized shipboard cooling plant, particularly on submarines. Thermoelectric coolers have no moving parts and hence have longer duty cycles.

A solution-based deposition method used to prepare the $RuO_2$ nanoscale films self-limits the coating at ~2 nm on nanowires, nanoscale networks, and fibers and is a simple, economical, atom-efficient, benchtop protocol that does not rely on synthesizing elaborate nanoscale inclusions in bulk material or using chemical vapor deposition, atomic-layer deposition, or vacuum-deposition methods. The approach provides conducting nanometric films that conformally coat a wide range of substrates ranging from planar to complex 3-D morphologies. A practical advantage is that the $RuO_2$ coating can be chemically or electrochemically modified using established techniques for metal oxide functionalization, including atomic-layer deposition, to deposit a material with a high Seebeck coefficient. The method and material provide new opportunities for thermoelectric devices without some of the limitations of homogeneous materials or bulk composites.

A key emphasis is to decouple the phononic component of thermal conductivity from the electronic component by preparing an established metallic conducting oxide as an ultrathin layer. Arranging functional matter in this fashion provides a means to decouple two transport properties critical to realizing high-performance thermoelectric devices, namely electronic conductivity and thermal conductivity. The thermally/electronically decoupled object with its too-low Seebeck coefficient is then modified by depositing a conformal thin film of a known thermoelectric material. The new composite—TE shell//electron shell// thermally insulating core (see FIG. 1)—adopts a Seebeck coefficient in keeping with the outmost shell of material, the thermoelectric material, thus further decoupling the interdependency of the variables in ZT, the thermoelectric figure of merit.

A chemically synthesized $RuO_2$ film as the first nanoscale shell has numerous potential advantages in terms of its properties, synthesis, and post-synthetic modification. Ruthenium dioxide is a well-established and technologically important electronic and electrocatalytic material with structure-dependant properties that can be tuned for applications such as electrolysis, electrocatalysis, electrochemical energy storage, and thick and thin film resistors (Adams et al., *J. Phys. Chem. B* 107 (2003) 6668-6697). High electronic conductivity occurs for single crystal and polycrystalline $RuO_2$, whereas electrocatalytic behavior is most common in defective forms of ruthenia, which are generally hydrous and contain varying amounts of structural disorder at both the surface and within the bulk ($RuO_2 \cdot xH_2O$ or $RuO_xH_y$). Surface-disordered $RuO_2$ is used extensively in the chloralkali industry to electrocatalyze production of chlorine gas from brine (Kuhn et al., *J. Electrochem. Soc.* 120 (1973) 231-234), and has received considerable attention as an electrode material that exhibits high specific capacitance (Trasatti et al., *J. Electroanal. Chem.* 29 (1971) A1), particularly in its bulk disordered form (Zheng et al., *J. Electrochem. Soc.* 142 (1995) 2699-2703). When disordered, this versatile oxide is also a high-performance Li-ion insertion material with high specific capacity and columbic efficiency as compared to conventional electrodes (Balaya et al., *Adv. Funct. Mater.* 13 (2003) 621-625; Lytle et al., *J. Mater. Chem.* 17 (2007) 1292-1299) and when combined with nanoscopic Pt is 250-times more effective as a fuel-cell catalyst/electrode for direct oxidation of methanol than $Pt_\alpha Ru_\beta$ alloy (Long et al., *J. Phys. Chem. B* 104 (2000) 9772-9776). The use of $RuO_2$ for less commodity-intensive processes than chloralkali is limited by the high-cost of ruthenium precursors. A current strategy for alleviating this cost-limitation is to disperse high-surface-area, nanoscale forms of $RuO_2$ on inexpensive substrates in order to optimize the number of catalytically active sites while minimizing the weight loading (Ryan et al., *Nature* 406 (2000) 169-172; Chervin et al., *Nano Lett.* 9 (2009) 2316-2321; Chervin et al., *J. Electroanal. Chem.* 644 (2010) 155-163; Hu et al., *Nano Lett.* 6 (2006) 2690-2695; Hu et al., *J. Electrochem. Soc.* 151 (2004) A281-A290; Kim et al., *Electrochem. Solid-State Lett.* 8 (2005) A369-A372).

One of the advantages of electrochemistry is the ability to deposit films on non-planar, three-dimensional morphologies without line-of-sight control. Other than electrophoretic deposition, these types of depositions require a substrate with sufficient electronic conductivity to act as a low-resistance electrode. The conductivity of the $RuO_2(SiO_2)$ paper is sufficient for it to serve as the working electrode on which to electrodeposit a conformal, thin film on top of the $RuO_2$ nanoshell. The concept of imposing a better Seebeck coefficient onto the poor S of the $RuO_2(SiO_2)$ object was demonstrated by using literature protocols to electrodeposit the semi-metal tellurium and compounds from the $Bi_xTe_y$ family of chalcogenides. Recent work (Takahashi et al., *Thin Solid Films* 240 (1994) 70-72; Magri et al., *J. Mater. Chem.* 6 (1996) 773-779) described electrodeposition of films of bismuth tellurium alloys from aqueous acidic electrolyte containing $TeO_2$ and $Bi(NO_3)_3$. The X-ray diffraction (XRD) characterization of the coatings indicated that based on the electrochemical conditions either polycrystalline $Bi_{2-x}Te_{3+x}$ or a mixture of $Bi_2Te_3$, a solid solution of $Bi_{2+x}Te_{3-x}$, and Te metal were formed (Magri et al., *J. Mater. Chem.* 6 (1996) 773-779). The Magri group showed that their Te-rich $Bi_2Te_3$ coatings had both a lower film resistivity and higher carrier concentration than single crystal $Bi_2Te_3$, which they attributed to high grain-to-grain connectivity in the polycrystalline material.

Magri et al. also reported galvanostatic (constant current) deposition rates of poly-crystalline $Bi_{2-x}Te_{3+x}$ films on planar stainless-steel electrodes at rates of 18.5 µm h$^{-1}$ (5 nm s$^{-1}$) at 25° C. To form thin films that are conformal, three approaches can be used to control the rate of deposition: (i) electrodeposition at temperatures less than 25° C.; (ii) pulsed deposition (at constant current) using sub-second pulse trains for times that total 1-2 seconds; and (iii) potentiostatic control of the electrodeposition at potentials or constant applied current where reduction of the precursor ions ($Bi^{3+}$ and $HTeO_2^+$) to metallic Bi and Te is kinetically slow. These variations on the literature electrodeposition procedures were tested and optimized by first using stainless-steel flag electrodes before attempting electrodeposition on $RuO_2(SiO_2)$ paper. Structural analysis by XRD verified that solid solutions of $Bi_{2+x}Te_{3-x}$ were electrodeposited. Energy-dispersive spectroscopy verified composition of Te metal films.

The article described above comprises three components: a porous thermally insulating material, an electrically conductive coating on the thermally insulating material, and a thermoelectric coating on the electrically conductive coating. As much as 80% or more of the mass of the article may be the thermally insulating material, and may be 90%, 95%, 99% or more. A higher percentage of thermally insulating material allows the thermal conductivity of the thermally insulating material to dominate the thermal conductivity of the article as a whole.

The thermally insulating material, or the bulk material of the same composition, has a thermal conductivity of at most 0.1 W m$^{-1}$ K$_{-1}$. A lower thermal conductivity may be more desirable to improve the thermal insulating properties of the article. For example, the thermal conductivity of a $SiO_2$ fiber paper is about 0.025 W m$^{-1}$K$^{-1}$.

Any porous thermally insulating material may be used. It may be macroscopic and large enough to manually handle, as opposed to microscopic. For example, the material may be at least 1 cm long in two of its dimensions. The thermally insulating material may be in the form of a structural scaffold supporting the electrically conductive coating and the thermoelectric coating. Scaffold forms include, but are not limited to, a foam, a particulate network, a fibrous structure, and a bonded polymer. A foam may have an open pore structure with connected pores in order to have continuous electrical conductivity in the conductive coating. Suitable materials include, but are not limited to, silica, polyurethane foam, cotton, polystyrene foam, and wool. The thermally insulating material may be amorphous or crystalline. When a polymer is used, it may be a block copolymer that may form two phases.

Silica ($SiO_2$) is one suitable material, including silica fiber and paper or membranes made therefrom as disclosed in US Patent Application Publication No. 2009/0092834. The membrane includes a plurality of $SiO_2$ fibers entangled to form a sheet. $SiO_2$ fiber membranes may be macroporous (pores sized>50 nm) with a relatively low surface area (on the order of <1 m$^2$ g$^{-1}$) and may be composed of submicron-to-micron-sized $SiO_2$ fibers. $SiO_2$ fiber membranes are flexible and can be easily molded to form quality electronic contacts with uneven surfaces. The $SiO_2$ fiber paper also has a degree of compressibility (softness) that helps in forming electronic contacts with other materials through pressure. Materials with higher surface areas may be used, though this can result in a larger amount of the electronically conductive coating in the article. As many electron conductors are also thermal conductors, a high surface area may reduce the thermal insulating properties of the article. It can be determined whether a particular material has an appropriate surface area for a particular application by forming the electrically conductive coating and measuring the resulting electrical conductivity of the article.

The electrically conductive coating may comprise any material considered to have metal-like conductivity. The conductive material may have a bulk electrical conductivity of at least 50 S cm$^{-1}$, including at least 500 S cm$^{-1}$ and at least 1000 S cm$^{-1}$. The conductivity of the article, either before or after the addition of the thermoelectric coating, may be less than the conductivity of the bulk electrically conductive material. The electrically conductive coating may be created by any method that produces a thin coating. Ruthenia (RuO$_2$) is a suitable conductor, which may be deposited on the insulator as disclosed herein and in US Patent Application Publication Nos. 2009/0092834 and 2011/0091723 and in U.S. Pat. Nos. 6,290,880 and 6,649,091. This method deposits ruthenia into the interior of the article. Ruthenia in particular maintains a high conductivity when deposited in a thin layer. Other suitable conductive materials include, but are not limited to, metals, graphite, and graphene. The electrically conductive coating may be at most 100 nm, 50 nm, 20 nm, 10 nm, 5 nm, 3 nm, or 2 nm thick and may be up to 1%, 5%, or 10% of the mass of the article.

The thermoelectric coating may comprise any thermoelectric material. The thermoelectric material may have a bulk Seebeck coefficient absolute value of at least 50 μV K$^{-1}$, including at least 100 μV K$^{-1}$. The Seebeck coefficient of the article may differ from that of the bulk thermoelectric material. Suitable thermoelectric materials include, but are not limited to, tellurium metal, tellurium oxide (TeO$_x$), a bismuth telluride (Bi$_2$Te$_3$, Bi$_{2+x}$Te$_{3-x}$) uranium dioxide, a perovskite, constantan, ytterbium trialuminide, and a dirty metal. Dirty metals are known thermoelectric materials that become electronically insulating at temperatures below the cryogenic regime (<77 K) and metallic at warmer temperatures. The thermoelectric coating may be created by any method that produces a thin coating including, but not limited to, electrodeposition. The thermoelectric coating may be at most 100 nm, 50 nm, 20 nm, 10 nm, 5 nm, 3 nm, or 2 nm thick and may be up to 1%, 5%, or 10% of the mass of the article.

In some embodiments, the electrically conductive material may be the same composition as the thermoelectric material, but treated to produce different properties. For example, the conductive coating may be heated to increase its conductivity, followed by coating the same material as the thermoelectric coating, but not heated to preserve its Seebeck coefficient.

The article may have a dimensionless figure of merit, defined above as the product of electric conductivity of the article, the square of the Seebeck coefficient of the article, and the operating temperature (such as ambient), divided by the thermal conductivity of the article, of at least 1 or at least 2 at room temperature.

Figure 3:
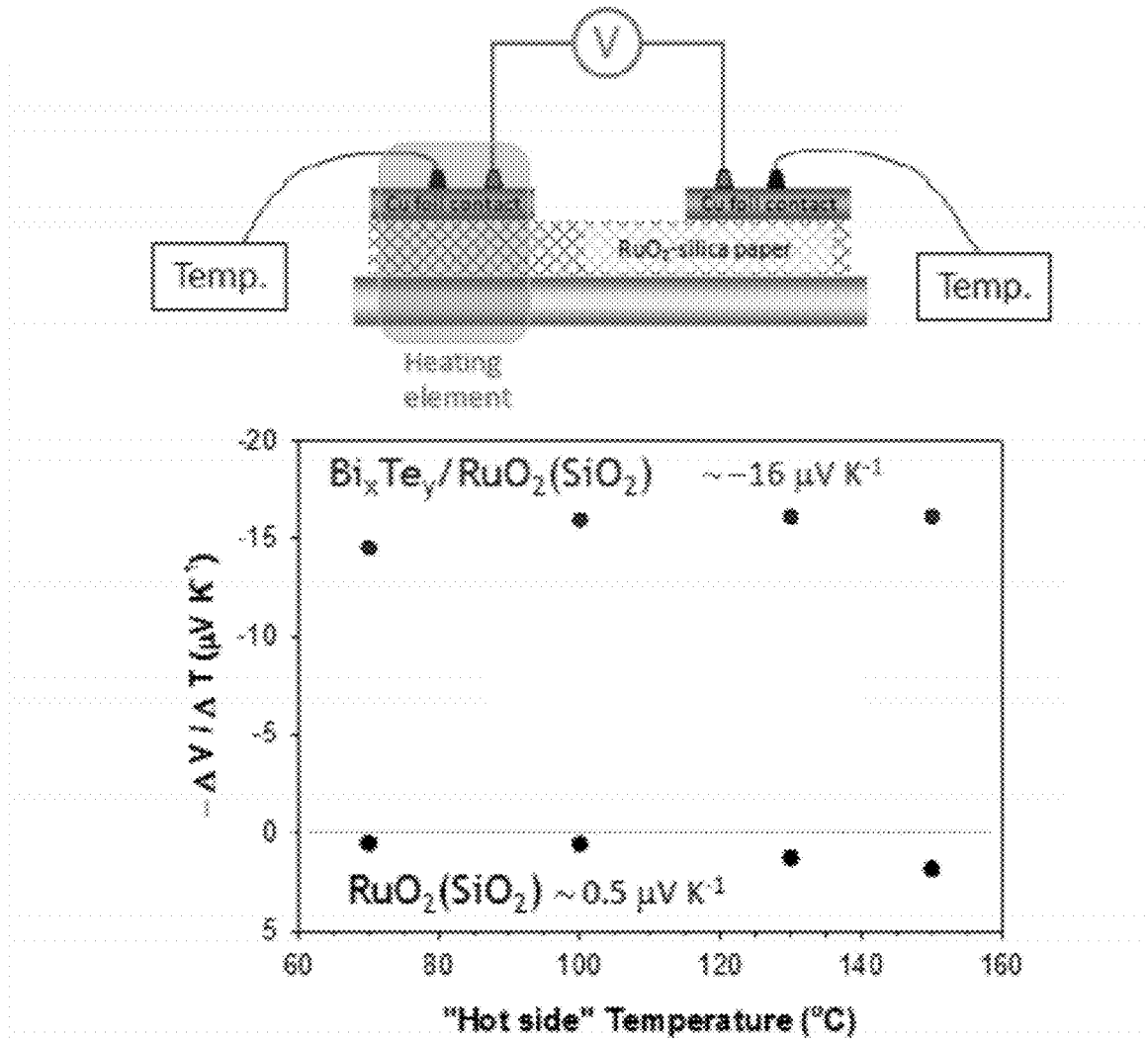
FIG. 3 shows thermopower measured for $RuO_2(SiO_2)$ before (lower points) and after (higher points) electrodeposition of a $Bi_xTe_y$ compound.
Figure 4:
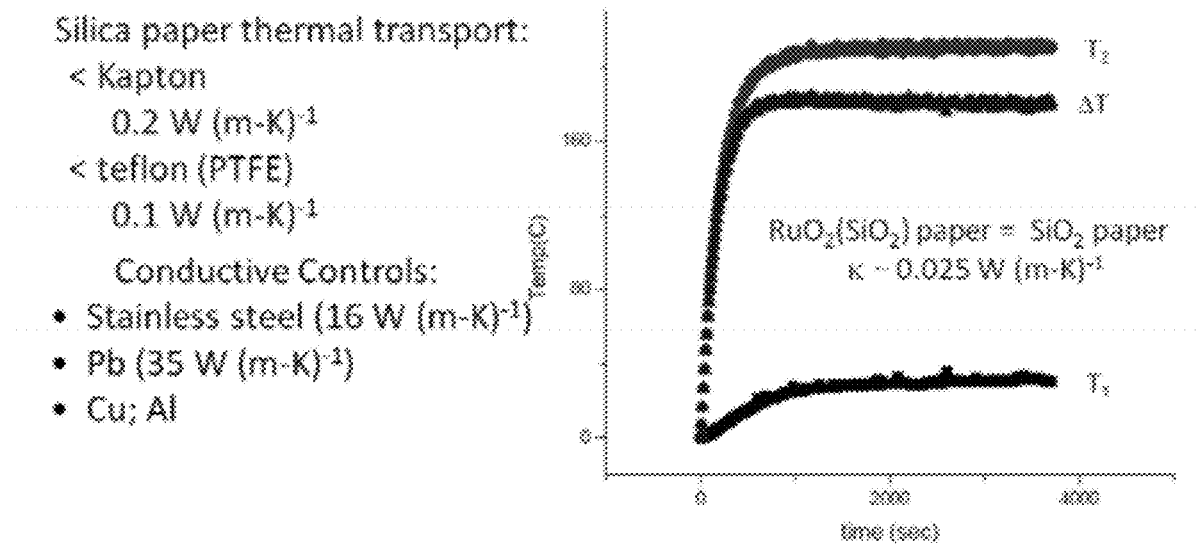
FIG. 4 shows thermal diffusivity of $SiO_2$ paper, $RuO_2(SiO_2)$ paper, and known thermal conductors and insulators. Thermal diffusivity differences between the standards were significant and the series trend matches the trend of thermal conductivity of the measured materials. From high-to-low thermal conductivity: Cu≈Al>Pb>stainless steel>>Kapton≈Teflon>$SiO_2$ paper=$RuO_2(SiO_2)$ paper.
Figure 5:
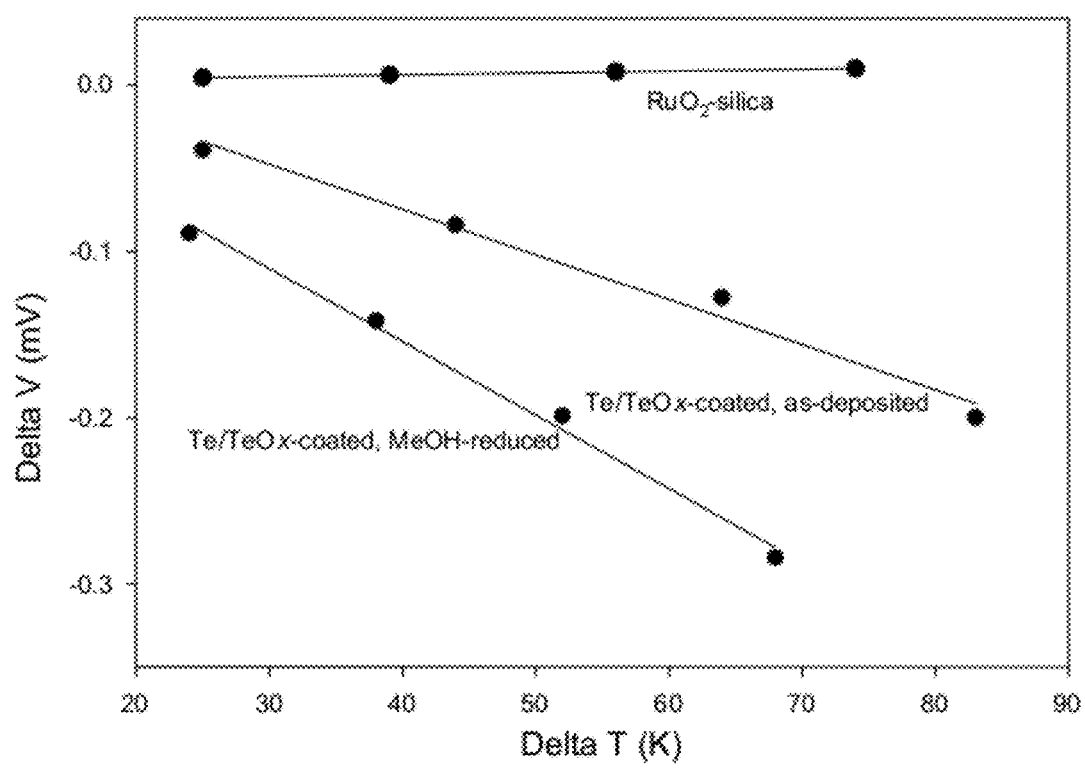
FIG. 5 shows thermopower measured for $RuO_2(SiO_2)$ before (upper curve) and after (middle curve) electrodeposition of the semi-metal Te (after prolonged exposure to air) and after (lower curve) partial reduction of the $TeO_x$ by exposure to a reductant (vapor-phase methanol).

A thermoelectric element may be made by placing two electrodes in contact with separated portions of the article, as schematically illustrated in FIG. 3. Such a thermoelectric element may generate a thermopower having an absolute value of at least 10 μV K$^{-1}$, including 20 μV K$^{-1}$ and 50 μV K$^{-1}$. The electrodes may be placed on two extreme ends of the article. A surface may be cooled by contacting a portion of the article on the surface and applying a voltage of appropriate polarity to the electrodes. The portion of the article contacting the surface may be immediately opposed to an electrode. Alternatively, a portion of the article near one electrode may be heated or cooled relative to the other electrode to generate a voltage between the electrodes.

The following examples are given to illustrate specific applications. These specific examples are not intended to limit the scope of the disclosure in this application.

EXAMPLE

Synthesis and Characterization of RuO$_2$ Films

Ruthenium oxide coatings were prepared via the decomposition of RuO$_4$ from organic solutions. To prepare the precursor solution, multiple aliquots of petroleum ether, pre-chilled for 1 min in a dry ice/acetone bath, were used to extract RuO$_4$ from an aqueous solution pre-chilled to T<5° C. (0.5 wt % solution, Strem Chemicals). After phase transfer, each aliquot of the nonaqueous precursor solution was rapidly mixed with a few milligrams of MgSO$_4$ (or other desiccant in order to remove water), passed through a coarse filter, and collected in a flask held in a dry ice/acetone bath. The nonaqueous solution (from the combined aliquots) was then thermally equilibrated in an aqueous ice bath and decanted into a pre-chilled (aqueous ice bath) glass vial containing the substrate of interest immersed in petroleum ether. The capped vial was then removed from the bath and held at room temperature overnight (~15 h), after which a faint brown/black coating was observed. The RuO$_2$-modified substrates were then rinsed with several aliquots of petroleum ether while sonicating followed by drying for several hours in air.

The resulting as-deposited RuO$_2$ coating had modest conductivity. The conductivity could be increased by several orders of magnitude by heating in air or O$_2$ to temperatures between ~150 and 250° C. The thickness of the RuO$_2$ coatings is estimated to be similar to those previously produced on silica paper (at ~2-3 nm) or planar substrates (at ~10 nm). Additional layers of RuO$_2$ can be deposited by subsequent deposition steps, with each layer adding another ~2-3 to 10 nm of RuO$_2$, increasing the conductivity of the coating.

Electrodeposition of Thermoelectric Materials on RuO$_2$ (SiO$_2$) Paper

Thin Bi$_x$Te$_y$ coatings were electrodeposited at the conductive surfaces of RuO$_2$(SiO$_2$) papers, using adaptations of previously published protocols (Martin-Gonzalez et al., *J. Electrochem. Soc.* 149 (2002) C546-C554). Although Bi$_x$Te$_y$ electrodeposition is seemingly simple, the resulting film composition, elemental stoichiometry, and orientation depends strongly on the solution composition and potential at which deposition occurs. The typical electrodeposition bath contained 1-5 mM of both Bi(NO$_3$)$_3$ and TeO$_2$ in a solution of 1 M HNO$_3$. Both constant-potential (0 V to –0.2 V vs. saturated calomel reference electrode) and constant-current (1-10 mA cm$^{-2}$) methods were used in conjunction with a three-electrode cell configuration, with typical deposition times of 30 min to 2 h. The resulting Bi$_x$Te$_y$-coated RuO$_2$(SiO$_2$) papers were characterized by scanning electron microscopy, energy-dispersive spectroscopy, and X-ray diffraction. The electrodeposited films could be poised from Bi$_x$Te$_y$ to Te as a function of potential.

Thermal Properties of RuO$_2$ Films

The thermal diffusivity of ultrathin RuO$_2$ films on SiO$_2$ papers was measured on strips of the paper long enough for a separation of at least 1 cm between hot and cold ends. When characterizing a single material with relatively high thermopower, compared to metals such as Cu or Au, it is possible to determine the Seebeck coefficient of that material by correcting for the minor contribution due to the metallic contacts. Thermopower was measured with Cu contacts to the TE-coated RuO$_2$(SiO$_2$) paper using the set-up shown schematically in FIG. 3 (or minor variations thereon).

Obviously, many modifications and variations are possible in light of the above teachings. It is therefore to be understood that the claimed subject matter may be practiced otherwise than as specifically described. Any reference to claim elements in the singular, e.g., using the articles "a," "an," "the," or "said" is not construed as limiting the element to the singular.

What is claimed is:

1. An thermoelectric article comprising:
a porous thermally insulating fibrous membrane comprising entangled, individual fibers;
a conformal electrically conductive coating directly on and surrounding the individual fibers of the thermally insulating membrane;
and a conformal thermoelectric coating on the electrically conductive coating of the individual fibers.

2. The thermoelectric article of claim 1, wherein the article contains at least 80% by mass of the thermally insulating material.

3. The thermoelectric article of claim 1, wherein the thermally insulating material has a thermal conductivity of at most 0.1 W m$^{-1}$ K$^{-1}$.

4. The thermoelectric article of claim 1, wherein the entangled, individual fibers are silica fibers.

5. The thermoelectric article of claim 1, wherein the electrically conductive coating comprises a material having a bulk electrical conductivity of at least 50 S cm$^{-1}$.

6. The thermoelectric article of claim 1, wherein the electrically conductive coating comprises ruthenia.

7. The thermoelectric article of claim 6, wherein the entangled, individual fibers are silica fibers.

8. The thermoelectric article of claim 1, wherein the electrically conductive coating is at most 100 nm thick.

9. The thermoelectric article of claim 1, wherein the thermoelectric coating comprises a material having a bulk Seebeck coefficient absolute value of at least 50 µV K$^{-1}$.

10. The thermoelectric article of claim 1, wherein the thermoelectric coating comprises one or more of tellurium, tellurium oxide, and a bismuth telluride.

11. The thermoelectric article of claim 10, wherein the entangled, individual fibers are silica fibers; and wherein the electrically conductive coating comprises ruthenia.

12. The thermoelectric article of claim 1, wherein the thermoelectric coating is at most 100 nm thick.

13. The thermoelectric article of claim 1, wherein the article has a figure of merit of at least 1 at room temperature.

14. A thermoelectric element comprising: the thermoelectric article of claim 1; and two electrodes in contact with separated portions of the article.

15. A method comprising:
placing a portion of the thermoelectric element of claim 14 in an area or on a surface to be cooled; and
applying a voltage between electrodes.

16. A method of forming a thermoelectric article comprising:
providing a porous thermally insulating fibrous membrane comprising entangled, individual fibers;
conformally coating an electrically conductive coating directly on and surrounding the individual fibers of the thermally insulating membrane;
and conformally coating a thermoelectric coating on the electrically conductive coating of the individual fibers.

17. The method of claim 16, wherein the article contains at least 80% by mass of the thermally insulating material.

18. The method of claim 16, wherein the entangled, individual fibers are silica fibers.

19. The method of claim 16, wherein the electrically conductive coating comprises ruthenia.

20. The method of claim 16, wherein the electrically conductive coating is at most 100 nm thick.

21. The method of claim 16, wherein the thermoelectric coating comprises one or more of tellurium, tellurium oxide, and a bismuth telluride.

22. The method of claim 16, wherein the thermoelectric coating is at most 100 nm thick.

* * * * *